(12) United States Patent
Gao et al.

(10) Patent No.: US 8,171,367 B2
(45) Date of Patent: *May 1, 2012

(54) STOPPING CRITERIA IN ITERATIVE DECODERS

(75) Inventors: Wen Gao, West Windsor, NJ (US); Joshua Lawrence Koslov, Hopewell, NJ (US)

(73) Assignee: Thomson Licensing, Issy les Moulineaux (FR)

( * ) Notice: Subject to any disclaimer, the term of this patent is extended or adjusted under 35 U.S.C. 154(b) by 1104 days.

This patent is subject to a terminal disclaimer.

(21) Appl. No.: 11/921,494

(22) PCT Filed: Jun. 27, 2005

(86) PCT No.: PCT/US2005/023007
§ 371 (c)(1),
(2), (4) Date: Dec. 3, 2007

(87) PCT Pub. No.: WO2007/001305
PCT Pub. Date: Jan. 4, 2007

(65) Prior Publication Data
US 2009/0249160 A1    Oct. 1, 2009

(51) Int. Cl.
*H03M 13/00* (2006.01)
(52) U.S. Cl. .................... 714/752; 714/758; 714/807
(58) Field of Classification Search .............. 714/752, 714/755, 758, 801, 794, 807, 800, 795
See application file for complete search history.

(56) References Cited

U.S. PATENT DOCUMENTS

| | | | |
|---|---|---|---|
| 6,518,892 B2 | 2/2003 | Shen et al. | |
| 6,526,531 B1 | 2/2003 | Wang | |
| 6,665,357 B1 | 12/2003 | Somayazulu | |
| 6,671,852 B1 | 12/2003 | Ariel et al. | |
| 6,678,857 B2 | 1/2004 | Sindhushayana et al. | |
| 7,128,270 B2 * | 10/2006 | Silverbrook et al. | .... 235/472.01 |
| 2001/0028690 A1 | 10/2001 | Ebel, Sr. | |
| 2001/0047501 A1 | 11/2001 | Sindhushayana et al. | |
| 2002/0026618 A1 | 2/2002 | Wang | |
| 2002/0194555 A1 | 12/2002 | Gueguen | |
| 2003/0023920 A1 | 1/2003 | Jeong et al. | |
| 2004/0006734 A1 | 1/2004 | Shin et al. | |
| 2004/0140915 A1 | 7/2004 | Shen et al. | |
| 2005/0283707 A1 * | 12/2005 | Sharon et al. | .................. 714/758 |

FOREIGN PATENT DOCUMENTS

| | | |
|---|---|---|
| JP | 2003032123 | 1/2003 |
| JP | 2004527142 | 9/2004 |

(Continued)

OTHER PUBLICATIONS

Fossorieer, M P C. "Iterative Reliability-Based Decoding of Low-Density Parity Check Codes" IEEE Journal on Selected Areas in Communications, IEEE Service Center, Piscatawy, US, vol. 19, No. 5, May 1, 2001, pp. 908-917.

(Continued)

*Primary Examiner* — Fritz Alphonse
(74) *Attorney, Agent, or Firm* — Robert D. Shedd; Jeffrey M. Navon (57) ABSTRACT

Methods and apparatus for reducing power consumption in an iterative decoder. A memory stores a decoded codeword for a current iteration and an iteration terminator compares the decoded codeword for the current iteration to the codeword from prior iterations, and further terminates the iterations when a confidence value is achieved.

13 Claims, 4 Drawing Sheets

FOREIGN PATENT DOCUMENTS

| | | |
|---|---|---|
| JP | 2005045735 | 2/2005 |
| KR | 20030016720 | 3/2003 |

OTHER PUBLICATIONS

Liu, Y. et al.: "An interactive concatenated turbo coding system," Proc., IEEE International Symposium on Information Theory, Jun. 25, 2000, p. 367, XP010510242.

Mac Kay, D.: "Good error-correcting codes based on very sparse matrices," IEEE Transations on Information Theory, IEEE Service Center, Piscataway, NJ, US, vol. 45, No. 2, Mar. 1999, pp. 399-431, XP002143042.

Matache, A. et al.: "Stopping rules for turbo decoders," TMO Progress Report, No. 42-142, Aug. 15, 2000, pp. 1-22, XP002225478.

Shao, R. Y. et al.: "Two simple stopping criteria for Turbo decoding," IEEE Transactions on Communications, vol. 7, No. 8, Aug. 1999, pp. 1117-1120, XP000848102.

* cited by examiner

STOPPING CRITERIA IN ITERATIVE DECODERS

This application claims the benefit, under 35 U.S.C. §365 of International Application PCT/US2005/023007, filed Jun. 27, 2005, which was published in accordance with PCT Article 21(2) on Jan. 4, 2007, in English.

FIELD OF THE INVENTION

The present invention relates generally to video decoders and, more particularly, to methods and apparatus for power reduction in iterative decoders.

BACKGROUND OF THE INVENTION

In recent years, low-density parity-check (LDPC) and turbo codes have been adopted as forward error correction codes in communication systems. For example, LDPC codes are used in the digital video broadcasting satellite version 2 (DVB-S2) standard for next-generation satellite communication systems, and turbo codes are used in wideband code-division multiple-access (WCDMA) systems.

The decoding algorithms for LDPC and turbo codes are iterative algorithms, wherein the decoder repeats a set of operations multiple times to decode the received codeword. For simplicity, a fixed number of iterations can be used in which case the amount of energy to decode one codeword is fixed. However, under normal operating conditions, a small fraction of the maximum number of iterations is actually required to achieve the same decoding performance.

Accordingly, it would be desirable and highly advantageous to have a method and apparatus for terminating the iterations before the maximum number of iterations is reached to reduce system power consumption while maintaining proper performance.

SUMMARY OF THE INVENTION

These and other drawbacks and disadvantages of the prior art are addressed by the present invention, which is directed to a method and apparatus for power reduction in iterative decoders.

According to an aspect of the present invention, there is provided an apparatus for reducing power consumption in an iterative decoder. The apparatus includes a memory device and an iteration termination device. The memory device is for storing a decoded codeword for a current iteration, for each iteration of the iterative decoder prior to a maximum number of iterations. The iteration termination device is for comparing the decoded codeword for the current iteration to a previously stored decoded codeword for the previous iteration, incrementing a confidence value when the decoded codeword for the current iteration matches the previously stored decoded codeword for the previous iteration, and terminating further iterations of the iterative decoder when the confidence value exceeds a pre-specified threshold value.

According to another aspect of the present invention, there is provided a method for reducing power consumption in an iterative decoder. The method includes the step of storing a decoded codeword for a current iteration in a buffer, for each iteration of the iterative decoder prior to a maximum number of iterations. The method also includes the step of comparing the decoded codeword for the current iteration to a previously stored decoded codeword for the previous iteration. The method further includes the step of incrementing a confidence value when the decoded codeword for the current iteration matches the previously stored decoded codeword for the previous iteration. Moreover, the method includes the step of terminating further iterations of the iterative decoder when the confidence value exceeds a pre-specified threshold value.

According to yet another aspect of the present invention, there is provided a computer program product including a computer usable medium that includes computer usable program code for reducing power consumption in an iterative decoder. The computer program product includes computer usable program code for causing the storage of a decoded codeword for a current iteration in a buffer, for each iteration of the iterative decoder prior to a maximum number of iterations. The computer program product further includes computer usable program code for incrementing a confidence value when the decoded codeword for the current iteration matches a previously stored decoded codeword for a previous iteration. The computer program product also includes computer usable program code for causing the termination of further iterations of the iterative decoder when the confidence value exceeds a pre-specified threshold value.

These and other aspects, features and advantages of the present invention will become apparent from the following detailed description of exemplary embodiments, which is to be read in connection with the accompanying drawings.

BRIEF DESCRIPTION OF THE DRAWINGS

The present invention may be better understood in accordance with the following exemplary figures, in which.

DETAILED DESCRIPTION

The present invention is directed to a method and apparatus for power reduction in iterative decoders. Advantageously, the present invention provides the power reduction by terminating the iteration process in an iterative decoder before a maximum allowable number of iterations is reached while maintaining decoding performance.

The present description illustrates the principles of the present invention. It will thus be appreciated that those skilled in the art will be able to devise various arrangements that, although not explicitly described or shown herein, embody the principles of the invention and are included within its spirit and scope.

All examples and conditional language recited herein are intended for pedagogical purposes to aid the reader in understanding the principles of the invention and the concepts contributed by the inventor to furthering the art, and are to be construed as being without limitation to such specifically recited examples and conditions.

Moreover, all statements herein reciting principles, aspects, and embodiments of the invention, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Thus, for example, it will be appreciated by those skilled in the art that the block diagrams presented herein represent conceptual views of illustrative circuitry embodying the principles of the invention. Similarly, it will be appreciated that any flow charts, flow diagrams, state transition diagrams, pseudocode, and the like represent various processes which may be substantially represented in computer readable media and so executed by a computer or processor, whether or not such computer or processor is explicitly shown.

The functions of the various elements shown in the figures may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor ("DSP") hardware, read-only memory ("ROM") for storing software, random access memory ("RAM"), and non-volatile storage.

Other hardware, conventional and/or custom, may also be included. Similarly, any switches shown in the figures are conceptual only. Their function may be carried out through the operation of program logic, through dedicated logic, through the interaction of program control and dedicated logic, or even manually, the particular technique being selectable by the implementer as more specifically understood from the context.

In the claims hereof, any element expressed as a means for performing a specified function is intended to encompass any way of performing that function including, for example, a) a combination of circuit elements that performs that function or b) software in any form, including, therefore, firmware, microcode or the like, combined with appropriate circuitry for executing that software to perform the function. The invention as defined by such claims resides in the fact that the functionalities provided by the various recited means are combined and brought together in the manner which the claims call for. It is thus regarded that any means that can provide those functionalities are equivalent to those shown herein.

Figure 1:
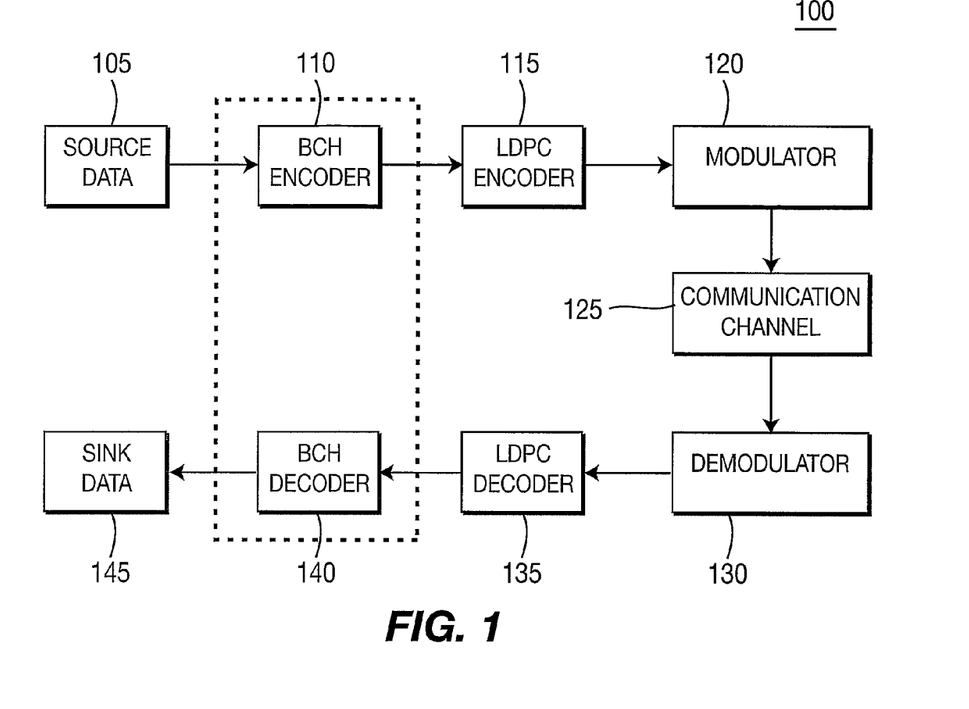
FIG. 1 shows a block diagram for a communication system to which the present invention in accordance with the principles of the present invention.

Turning to FIG. 1, a communication system to which the present invention may be applied is indicated generally by the reference numeral 100. The communication system uses low-density parity-check (LDPC). Bose-Chaudhuri-Hocquenghem (BCH) code or other error control code including, but not limited to, Reed Solomon (RS) code, may be added to the communication system 100 to achieve a very low probability of bit error. For example, the digital video broadcasting satellite version 2 (DVB-S2) standard employs the coding schemes shown and described with respect to FIG. 1.

The communication system includes a data source 105, a BCH encoder 110, an LDPC encoder 115, a modulator 120, a communication channel 125, a demodulator 130, an LDPC decoder 135, a BCH decoder 140, and a data sink 145.

An output of the data source 105 is connected in signal communication with an input of the BCH encoder 110. An output of the BCH encoder is connected in signal communication with an input of the LDPC encoder 115. An output of the LDPC encoder 115 is connected in signal communication with an input of the modulator 120. An output of the modulator is connected in signal communication with an input of the communication channel 125. An output of the communication channel 125 is connected in signal communication with an input of the demodulator 130. An output of the demodulator is connected in signal communication with an input of a LDPC decoder 135. An output of the LDPC decoder 135 is connected in signal communication with an input of the BCH decoder 140. An output of the BCH decoder 140 is connected in signal communication with an input of the data sink 145.

It is to be appreciated that the present invention is not limited to use only with the communication system 100 of FIG. 1 and, thus, given the teachings of the present invention provided herein, one of ordinary skill in this and related arts will contemplate other communication systems and communication system configurations to which the present invention may be applied while maintaining the scope of the present invention.

Moreover, it is to be appreciated that the present invention is not limited to the codes described herein and, thus, given the teachings of the present invention provided herein, one of ordinary skill in this and related arts will contemplate other codes to which the present invention may be applied while maintaining the scope of the present invention.

Figure 2:
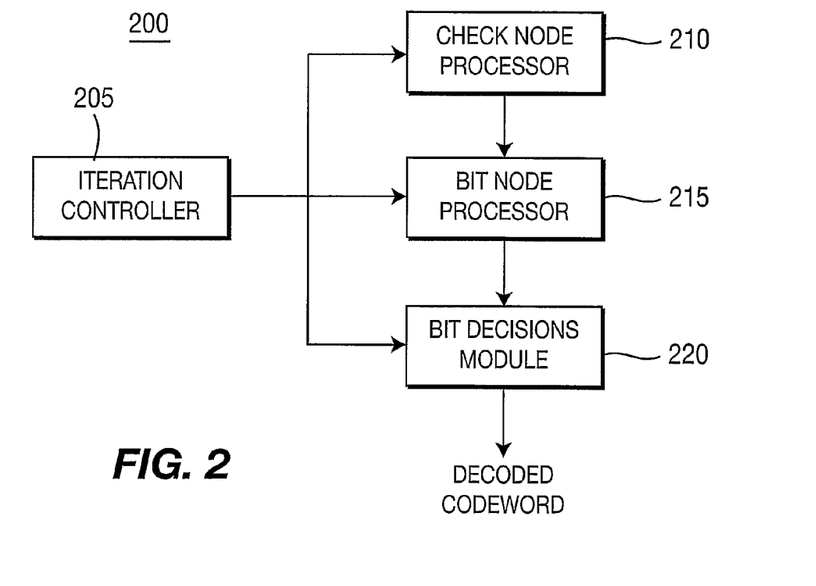
FIG. 2 shows a block diagram for an LDPC decoder that uses a fixed number of iterations in accordance with the prior art.

Turning to FIG. 2, an LDPC decoder that uses a fixed number of iterations is indicated generally by the reference numeral 200.

The LDPC decoder 200 includes an iteration controller 205, a check node processor 210, a bit node processor 215, and a bit decisions module 220.

An output of the iteration controller 205 is connected in signal communication with a first input of the check node processor 210, a first input of the bit node processor 215, and a first input of the bit decisions module 220.

An output of the check node processor 210 is connected in signal communication with a second input of the bit node processor 215. An output of the bit node processor 215 is connected in signal communication with a second input of the bit decisions module. An output of the bit decisions module 220 is available as an output of the LDPC decoder 200. The output of the LDPC decoder 200 provides decoded code words.

Thus, after initialization, each decoding iteration involves check node processing, bit node processing, and bit decisions. The iteration controller 205 generates all required control signals for the other elements, and counts the number of iterations. When the number of iterations reaches a maximum number, the iteration controller 205 terminates the decoding process and the decoded codeword is outputted.

The advantage of the above scheme is simplicity: the decoder 200 consumes the same amount of power for every received codeword. However, the communication channel is usually dynamic and the maximum number of iterations is set by the timing constraints, maximum allowable power and the worst channel conditions. Under normal channel conditions, the decoder usually requires less iterations than the maximum to successfully decode the received codeword.

Advantageously, the present invention provides a method and apparatus to determine the convergence of the decoding process and terminate the iteration process accordingly. To accomplish this, an iteration termination module and a decoded codeword buffer are added to the decoder of FIG. 2, as shown in FIG. 3.

Figure 3:
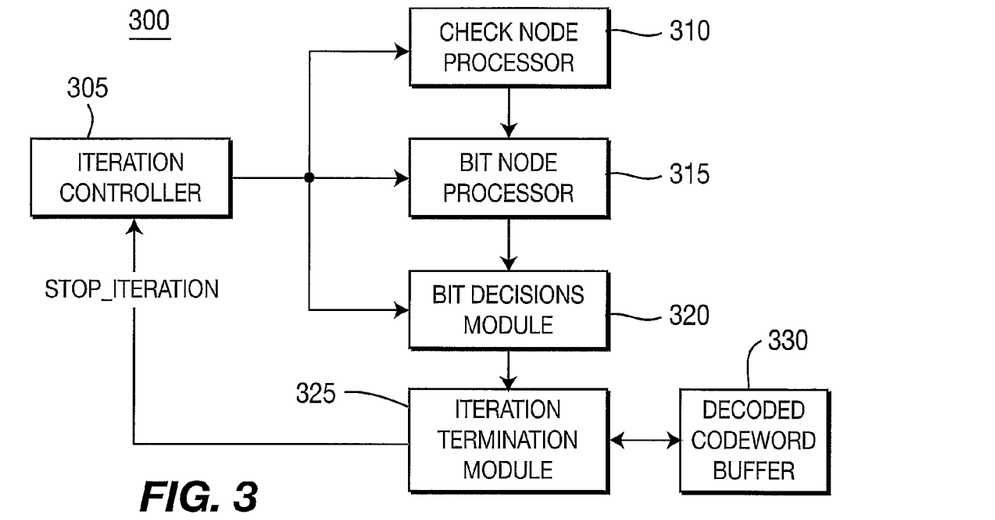
FIG. 3 shows a block diagram for an LDPC decoder with adaptive iteration termination in accordance with the principles of the present invention.

Turning to FIG. 3, an LDPC decoder with adaptive iteration termination is indicated generally by the reference numeral 300.

The LDPC decoder 300 includes an iteration controller 305, a check node processor 310, a bit node processor 315, a bit decisions module 320, an iteration termination module 325, and a decoded codeword buffer 330.

An output of the iteration controller 305 is connected in signal communication with a first input of the check node processor 310, a first input of the bit node processor 315, and a first input of the bit decisions module 320.

An output of the check node processor 310 is connected in signal communication with a second input of the bit node processor 315. An output of the bit node processor 315 is connected in signal communication with a second input of the bit decisions module. An output of the bit decisions module 320 is available as an output of the LDPC decoder 300. The output of the LDPC 300 provides decoded code words.

A description will now be given regarding a method for adaptive iteration termination for an iterative decoder in accordance with one embodiment of the present invention. The method will initially be described generally, and subsequently described in further detail with respect to FIG. 4.

Figure 4:
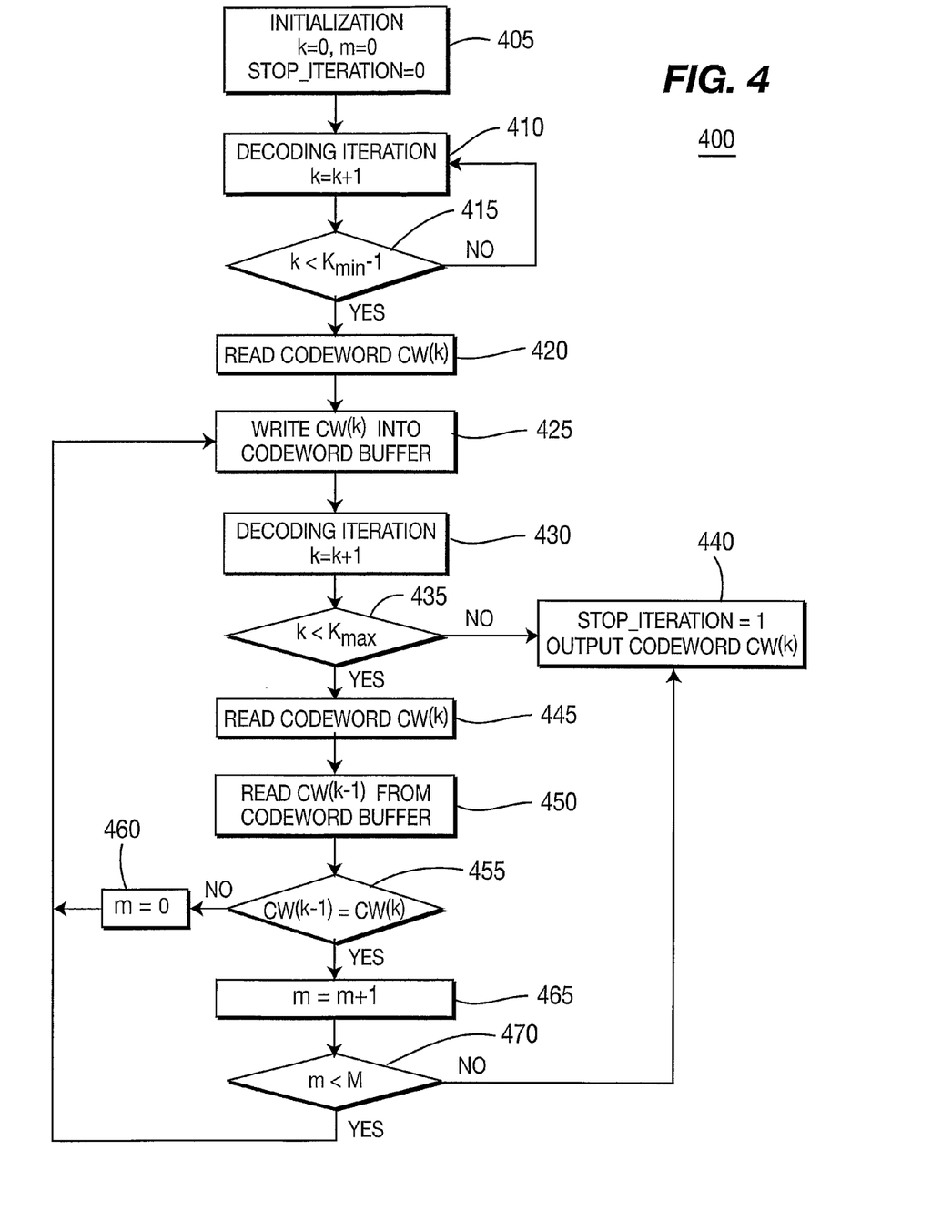
FIG. 4 shows a flow diagram for a method for adaptive iteration termination for an iterative decoder in accordance with the principles of the present invention.

The following designations are used with respect to FIG. 4: k denotes the iteration index; $K_{min}$ and $K_{max}$ represent the minimum and maximum number of iterations; Stop_iteration is a control signal that is sent to the iteration controller to stop the iteration process; and m is a confidence counter which represents that the current decoded codeword is the same as the decoded codeword of the previous m iterations.

The process of iteration termination is as follows: when the number of iterations k reaches $K_{min}-1$, the decoded codeword is written into the codeword buffer. As long as $k<K_{max}$, the decoded codeword of the k-th iteration $CW^{(k)}$ is compared with the previous decoded codeword, which is stored in the buffer, i.e., $CW^{(k-1)}$. If the two codewords are the same, the confidence counter m is incremented; otherwise, the counter is reset to 0. When m reaches the preset value M, the control signal Stop_iteration is set to 1, which informs the iteration controller to stop the iteration process. While m<M, the decoded codeword $CW^{(k)}$ is written into the codeword buffer. Note that the parameters $K_{min}$, $K_{max}$, and M are adjustable. To reduce the power consumption of the decoder, we can set $K_{min}$ as the required number of iterations under normal channel conditions. Thus, we avoid unnecessary comparison and read/write operations. $K_{max}$ is determined by the timing constraints, peak power consumption, and the worst channel conditions. M is usually set to one since, as long as the current decoded output is the same as the one in the previous iteration, the decoding algorithm is usually converged and the correct codeword is obtained.

Turning to FIG. 4, a method for adaptive iteration termination for an iterative decoder is indicated generally by the reference numeral 400. In FIG. 4, as noted above, k denotes the iteration index; $K_{min}$ and $K_{max}$ represent the minimum and maximum number of iterations; Stop_iteration is a control signal that is sent to the iteration controller to stop the iteration process; and m is a confidence counter which represents that the current decoded codeword is the same as the decoded codeword of the previous m iterations.

An initialization block 405 sets variables k, m, and Stop_iteration equal to zero, and passes control to a function block 410. The function block 410 adds one to the variable k, and passes control to a decision block 415. The decision block 415 determines whether or not k is equal to $K_{min}-1$. If $K_{min}-1$ is not equal to k, then control is returned to function block 410. Otherwise, if $K_{min}-1$ is equal to k, then control is passed to a function block 420.

The function block 420 reads the decoded codeword $CW^{(k)}$, and passes control to a function block 425. The function block 425 writes the decoded codeword $CW^{(k)}$ is written into the codeword buffer, and passes control to a function block 430. The function block 430 adds one to the variable k, and passes control to a decision block 435. The decision block 435 determines whether or not $k<K_{max}$. If $k \geq K_{max}$, then control is passed to a function block 440. Otherwise, if $k<K_{max}$, then control is passed to a function block 445.

The function block 440 set the variable Stop_iteration equal to one, and outputs the decoded codeword $CW^{(k)}$.

The function block 445 reads the codeword $CW^{(k)}$ from the codeword buffer, and passes control to a function block 450. The function block 450 reads the codeword $CW^{(k-1)}$ from the codeword buffer, and passes control to a decision block 455. The decision block 455 determines whether or not $CW^{(k-1)}$ is equal to $CW^{(k)}$. If $CW^{(k-1)}$ is not equal to $CW^{(k)}$, then control is passed to a function block 460. Otherwise, if $CW^{(k-1)}$ is equal to $CW^{(k)}$, then control is passed to a function block 465. The function block 465 adds one to the variable m, and passes control to a decision block 470. The decision block 470 determines whether or not m<M. If m≧M, then control is passed to function block 440. Otherwise, if m<M, then control is returned to function block 425.

For a system utilizing the concatenation of an LDPC decoder and outer decoder, such as a BCH decoder or an RS decoder, as shown in FIG. 1, further power reduction can be achieved.

Thus, a description will now be given regarding another method for adaptive iteration termination for an iterative decoder in accordance with another embodiment of the present invention. The method will initially be described generally, and subsequently described in further detail with respect to FIG. 5.

Figure 5:
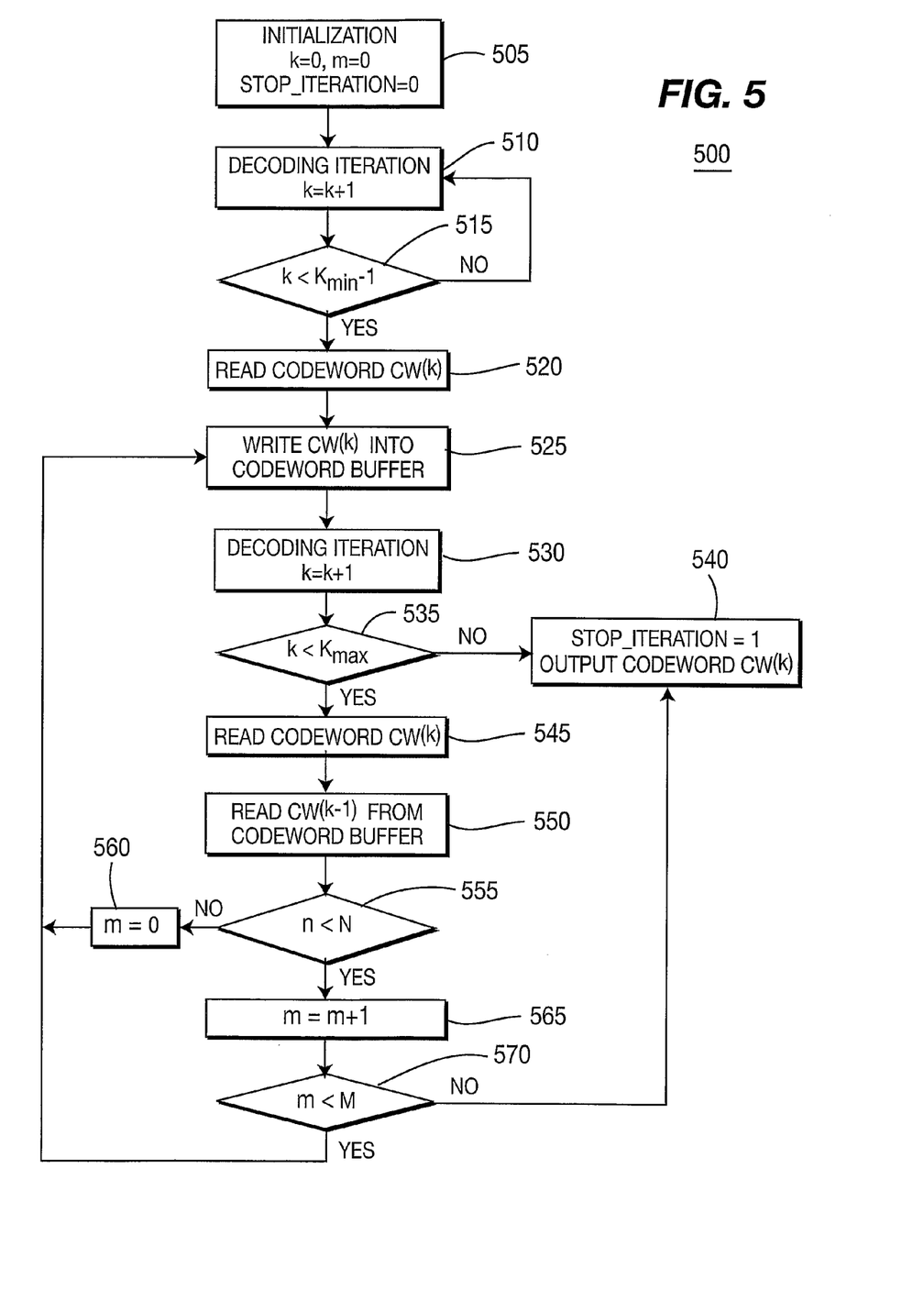
FIG. 5 shows a flow diagram for another method for adaptive iteration termination for an iterative decoder in accordance with the principles of the present invention.

In practice, the outer decoder is used to correct the residual errors after iterative LDPC decoding. The outer decoder often can correct tens of bit errors. In addition, the outer code decoding operation usually consumes less power than one iterative decoding operation. The bit difference between the current decoded codeword from the LDPC decoder and the decoded codeword of the previous iteration of the LDPC decoder can be used as an indication of the number of bit errors in the codeword. Thus, if the bit difference is less than a certain number, we can stop the iteration process, and let the outer decoder correct the remaining bit errors in the LDPC decoded codeword. The modified approach is shown in FIG. 5, where $n=\text{diff}(CW^{(k)}, CW^{(k-1)})$ represents that the number of different bits between $CW^{(k)}$ and $CW^{(k-1)}$ is computed and stored into the variable n, and N is a preset value that is related to the BCH decoder error correction capability. Note that additional power reduction can be achieved if n=0 when the LDPC iteration process terminates, since n=0 indicates the decoding algorithm has converged. Due to the property of the iterative decoding algorithm, when it converges, the decoded codeword is usually correct, hence we can bypass the outer decoder, to further reduce the system power consumption.

On the other hand, when n is greater than a certain number $N_{max}$, this indicates that the number of bit errors exceeds the error correction capability of the outer decoder. Again, we can bypass the outer decoder to reduce system power consumption. The numbers N and $N_{max}$ need to be determined using the convergence property of the iterative decoding algorithm and the error correction capability of the outer decoder.

Turning to FIG. 5, another method for adaptive iteration termination for an iterative decoder is indicated generally by the reference numeral 500.

An initialization block 505 sets variables k, m, and Stop_iteration equal to zero, and passes control to a function block 510. The function block 510 adds one to the variable k, and passes control to a decision block 515. The decision block 515 determines whether or not k is equal to $K_{min}-1$. If $K_{min}-1$ is not equal to k, then control is returned to function block 510. Otherwise, if $K_{min}-1$ is equal to k, then control is passed to a function block 520.

The function block 520 reads the decoded codeword $CW^{(k)}$, and passes control to a function block 525. The function block 525 writes the decoded codeword $CW^{(k)}$ is written into the codeword buffer, and passes control to a function block 530. The function block 530 adds one to the variable k, and passes control to a decision block 535. The decision block 535 determines whether or not $k<K_{max}$. If $k \geq K_{max}$, then control is passed to a function block 540. Otherwise, if $k<K_{max}$, then control is passed to a function block 545.

The function block 540 set the variable Stop_iteration equal to one, and outputs the decoded codeword $CW^{(k)}$.

The function block 545 reads the codeword $CW^{(k)}$ from the codeword buffer, and passes control to a function block 550. The function block 550 reads the codeword $CW^{(k-1)}$ from the codeword buffer, and passes control to a function block 552. The function block 552 computes the number of different bits between $CW^{(k)}$ and $CW^{(k-1)}$, stores the number of different bits into the variable n (i.e., $n=diff(CW^{(k)}, CW^{(k-1)})$, and passes control to a decision block 555. The decision block 555 determines whether or not n<N, where N is a preset value that is related to the BCH decoder error correction capability. If $n \geq N$, then control is passed to a function block 560. Otherwise, if n<N, then control is passed to a function block 565. The function block 565 adds one to the variable m, and passes control to a decision block 570. The decision block 570 determines whether or not m<M. If $m \geq M$, then control is passed to function block 540. Otherwise, if m<M, then control is returned to function block 525.

A description will now be given regarding yet another method for adaptive iteration termination for an iterative decoder in accordance with yet another embodiment of the present invention. The method will initially be described generally, and subsequently described in further detail with respect to FIG. 6.

Figure 6:
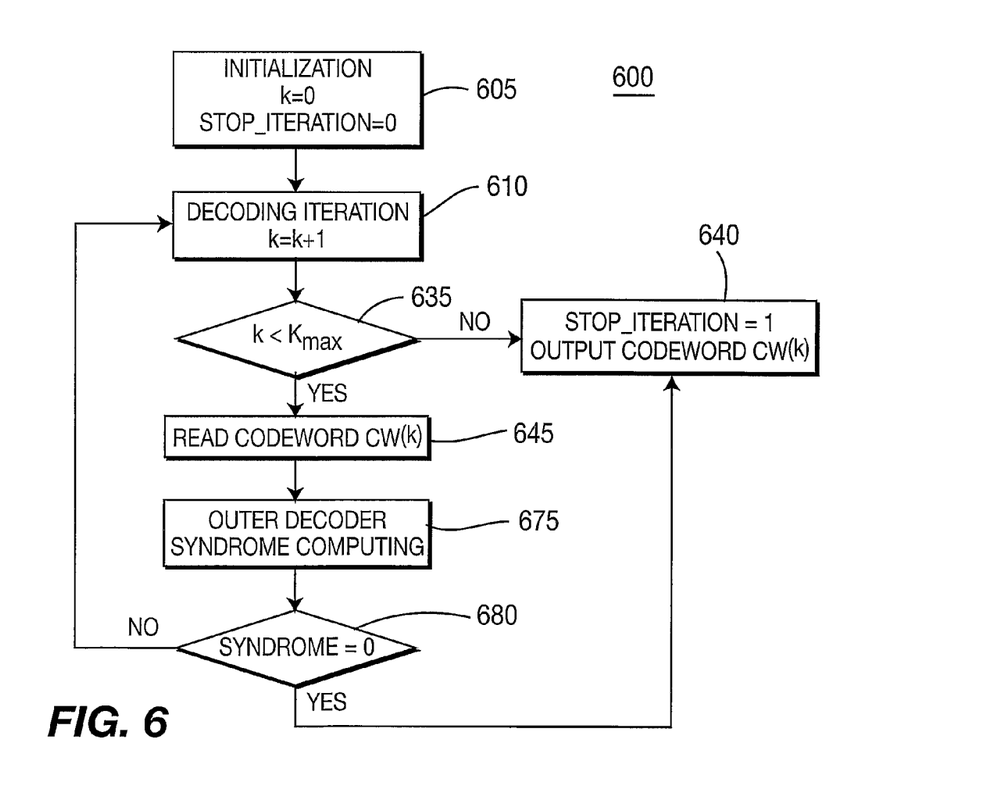
FIG. 6 shows a flow diagram for yet another method for adaptive iteration termination for an iterative decoder in accordance with the principles of the present invention.

Yet another way to terminate the iteration decoding process is to use the outer decoder to determine if there are bit errors in the inner decoded codeword. For example, the outer decoder, such as an RS decoder or a BCH decoder, can compute the syndrome of the inner decoded codeword. If the syndrome is all zero, the outer decoder declares that the codeword is correct and informs the inner decoder to stop the iteration process. Otherwise, the inner decoder continues the iteration process until it reaches the maximum number of iterations.

Turning to FIG. 6, yet another method for adaptive iteration termination for an iterative decoder is indicated generally by the reference numeral 400. In FIG. 4, as noted above, k denotes the iteration index; $K_{min}$ and $K_{max}$ represent the minimum and maximum number of iterations; Stop_iteration is a control signal that is sent to the iteration controller to stop the iteration process; and m is a confidence counter which represents that the current decoded codeword is the same as the decoded codeword of the previous m iterations.

An initialization block 605 sets variables k, and Stop_iteration equal to zero, and passes control to a function block 610. The function block 610 adds one to the variable k, and passes control to a decision block 635. The decision block 435 determines whether or not $k<K_{max}$. If $k \geq K_{max}$, then control is passed to a function block 640. Otherwise, if $k<K_{max}$, then control is passed to a function block 645.

The function block 640 set the variable Stop_iteration equal to one, and outputs the decoded codeword $CW^{(k)}$.

The function block 645 reads the codeword $CW^{(k)}$ from the codeword buffer, and passes control to a function block 675. The function block 675, relating to the outer decoder, computes the syndrome of the inner decoded codeword, and passes control to a decision block 680. The decision block 680 determines whether or not the syndrome of the inner decoded codeword is equal to zero. If the syndrome of the inner decoded codeword is not equal to zero, then control is returned to function block 610. Otherwise, if the syndrome of the inner decoded codeword is equal to zero, then control is returned to function block 640.

It is to be appreciated that the step for syndrome computation is part of the outer decoder, and can be implemented very efficiently, consuming only a small amount of power. The advantage of this approach is that no extra module, except perhaps some simple logic, is required.

These and other features and advantages of the present invention may be readily ascertained by one of ordinary skill in the pertinent art based on the teachings herein. It is to be understood that the teachings of the present invention may be implemented in various forms of hardware, software, firmware, special purpose processors, or combinations thereof.

Most preferably, the teachings of the present invention are implemented as a combination of hardware and software. Moreover, the software is preferably implemented as an application program tangibly embodied on a program storage unit. The application program may be uploaded to, and executed by, a machine comprising any suitable architecture. Preferably, the machine is implemented on a computer platform having hardware such as one or more central processing units ("CPU"), a random access memory ("RAM"), and input/output ("I/O") interfaces. The computer platform may also include an operating system and microinstruction code. The various processes and functions described herein may be either part of the microinstruction code or part of the application program, or any combination thereof, which may be executed by a CPU. In addition, various other peripheral units may be connected to the computer platform such as an additional data storage unit and a printing unit.

It is to be further understood that, because some of the constituent system components and methods depicted in the accompanying drawings are preferably implemented in software, the actual connections between the system components or the process function blocks may differ depending upon the manner in which the present invention is programmed. Given the teachings herein, one of ordinary skill in the pertinent art will be able to contemplate these and similar implementations or configurations of the present invention.

Although the illustrative embodiments have been described herein with reference to the accompanying drawings, it is to be understood that the present invention is not limited to those precise embodiments, and that various changes and modifications may be effected therein by one of ordinary skill in the pertinent art without departing from the scope or spirit of the present invention. All such changes and modifications are intended to be included within the scope of the present invention as set forth in the appended claims.

The invention claimed is:

1. An apparatus for reducing power consumption in an iterative decoder, comprising:
   a memory device for storing, for each iteration of the iterative decoder prior to a maximum number of iterations, a decoded codeword for a current iteration; and
   an iteration termination device for comparing the decoded codeword for the current iteration to a previously stored decoded codeword for the previous iteration, incrementing a confidence value when the decoded codeword for the current iteration matches the previously stored decoded codeword for the previous iteration, and terminating further iterations of the iterative decoder when the confidence value exceeds a pre-specified threshold value.

2. The apparatus according to claim 1, wherein the pre-specified threshold value is equal to one.

3. The apparatus according to claim 1, wherein values of the pre-specified threshold and the maximum number of iterations are adjustable.

4. The apparatus according to claim 1, wherein $K_{min}$ is equal to a minimum number of iterations required to decode the codeword under normal channel conditions, and said memory device stores the decoded codeword for the current iteration when a current number of iterations is equal to $K_{min}$.

5. The apparatus according to claim 1, wherein said iteration termination device resets the confidence value to zero, when the confidence value does not exceed the pre-specified threshold value.

6. The apparatus according to claim 1, wherein said memory device is further for storing the confidence value.

7. The apparatus according to claim 1, wherein the iterative decoder includes an iteration controller, and said iteration termination device terminates the further iterations of the iterative decoder by generating a stop iterating control signal and transmitting the stop iterating control signal to the iteration controller.

8. A method for reducing power consumption in an iterative decoder, comprising the steps of:
   for each iteration of the iterative decoder prior to a maximum number of iterations, storing a decoded codeword for a current iteration in a buffer;
   comparing the decoded codeword for the current iteration to a previously stored decoded codeword for the previous iteration;
   incrementing a confidence value when the decoded codeword for the current iteration matches the previously stored decoded codeword for the previous iteration; and
   terminating further iterations of the iterative decoder when the confidence value exceeds a pre-specified threshold value.

9. The method according to claim 8, wherein the pre-specified threshold value is equal to one.

10. The method according to claim 8, wherein values of the pre-specified threshold and the maximum number of iterations are adjustable.

11. The method according to claim 8, wherein $K_{min}$ is equal to a minimum number of iterations required to decode the codeword under normal channel conditions, and said storing step is initiated when a current number of iterations is equal to $K_{min}$.

12. The method according to claim 8, further comprising the step of resetting the confidence value to zero, when the confidence value does not exceed the pre-specified threshold value.

13. The method according to claim 8, further comprising the step of storing the confidence value in the buffer.

* * * * *